(12) United States Patent
Foust et al.

(10) Patent No.: US 6,417,062 B1
(45) Date of Patent: Jul. 9, 2002

(54) METHOD OF FORMING RUTHENIUM OXIDE FILMS

(75) Inventors: Donald Franklin Foust, Glenville; James Wilson Rose, Guilderland; Ernest Wayne Balch, Ballston Spa, all of NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/562,194

(22) Filed: May 1, 2000

(51) Int. Cl.[7] .................. H01L 21/20; H01L 21/44; H01L 21/31; C23C 14/02

(52) U.S. Cl. .............. 438/384; 438/382; 438/686; 438/785; 427/534

(58) Field of Search .................. 438/382, 384, 438/686, 785; 427/534

(56) References Cited

U.S. PATENT DOCUMENTS

| | | | |
|---|---|---|---|
| 4,204,107 A | * 5/1980 | Ohkubo et al. | 219/216 |
| 4,427,749 A | * 1/1984 | Graetzel et al. | 429/111 |
| 5,144,536 A | * 9/1992 | Tsukada et al. | 361/402 |
| 5,155,658 A | * 10/1992 | Inam et al. | 361/321 |
| 5,358,889 A | 10/1994 | Emesh et al. | 437/60 |
| 5,372,849 A | * 12/1994 | McCormick et al. | 427/253 |
| 5,510,594 A | * 4/1996 | Mori et al. | 219/121.69 |
| 5,600,535 A | * 2/1997 | Jow et al. | 361/503 |
| 5,805,049 A | * 9/1998 | Yamada et al. | 338/25 |
| 5,851,896 A | * 12/1998 | Summer felt | 438/396 |
| 5,853,310 A | * 12/1998 | Nishimura et al. | 445/1.24 |
| 5,866,988 A | * 2/1999 | Oda | 315/169.1 |
| 5,874,770 A | 2/1999 | Saia et al. | 257/536 |
| 5,883,437 A | * 3/1999 | Maruyama et al. | 257/773 |
| 5,986,301 A | * 11/1999 | Fukushima et al. | 257/306 |
| 6,013,950 A | * 1/2000 | Nasby | 257/734 |

(List continued on next page.)

FOREIGN PATENT DOCUMENTS

JP 406104255 * 4/1994

OTHER PUBLICATIONS

J. P. Zheng, Pulsed Laser Deposition of Ruthenium dioxide, Mar. 1996, The Electrochemical Society, Inc., vol. 143, No.: 3.*

H.S. Cole, et al, Laser–Induced Selective Copper Deposition on Polyimide, Appl. Phys. Lett. 53(21), Nov. 1988, pp. 2111–2113.

E. Kolawa, et al, Reactive Sputtering of $RuO_2$ Films, Thin Solid Films 173 (1989), pp. 217–224.

E. Kolawa, et al, *Microstructure of Reactively Sputtered Oxide Diffusion Barriers*, J. of Electronic Materials, vol. 17, No. 5, 1988, pp. 425–432.

L. Krusin–Elbaum, et al, Characterization of Reactively Sputtered Ruthenium Dioxide for Very Large Scale Integrated Metallization, Appl. Phys. Lett 50(26) Jun. 1987, pp. 1879–1881.

(List continued on next page.)

*Primary Examiner*—Matthew Smith
*Assistant Examiner*—Chuong A Luu

(57) ABSTRACT

A method of forming a ruthenium dioxide film for such purposes as the fabrication of stable thin-film resistors for microcircuits. The method generally entails forming an inorganic ruthenium-based film on a substrate, and then thermally decomposing at least a portion of the ruthenium-based film by exposure to a high-intensity beam of radiation, preferably visible light, to yield a ruthenium dioxide film on the substrate. Particular ruthenium-based precursors useful for forming the ruthenium-based film include ruthenium (III) chloride ($RuCl_3.nH_2O$) and ruthenium (III) nitrosyl nitrate. The method does not require a thermal treatment that heats the bulk of the substrate on which the ruthenium dioxide film is formed, and is therefore suitable for non-ceramic substrate materials, e.g., polymers such as those used as printed circuit boards (PCBs) and flexible circuits.

20 Claims, 1 Drawing Sheet

U.S. PATENT DOCUMENTS

| | | | | |
|---|---|---|---|---|
| 6,020,048 A | * | 2/2000 | Oka et al. | 428/209 |
| 6,074,945 A | * | 6/2000 | Vaartstra et al. | 438/681 |
| 6,097,588 A | * | 8/2000 | Zheng et al. | 361/503 |
| 6,159,322 A | * | 12/2000 | Ogata et al. | 156/230 |
| 6,175,752 B1 | * | 1/2001 | Say et al. | 600/345 |
| 6,180,164 B1 | * | 1/2001 | Ellis et al. | 427/101 |
| 6,197,628 B1 | * | 3/2001 | Vaarstra et al. | 438/238 |
| 6,268,522 B1 | * | 7/2001 | Hagemeyer et al. | 560/245 |
| 6,296,896 B1 | * | 10/2001 | Takahashi et al. | 427/77 |

OTHER PUBLICATIONS

E. Kolawa, et al, Reactively Sputtered $RuO_2$ Diffusion Barriers, Appl. Phys. Lett. 50(13) Mar. 1987, pp. 854–855.

Jie Si, et al, $RuO_2$ Films by Metal–Organic Chemical Vapor Deposition, J. Mater. Res., vol. 8, No. 10, Oct. 1993, pp. 2644–2648.

L. Meda, et al, Chemical Vapor Deposition of Ruthenium Dioxide Thin Films From GBIS(2,4–Dimethypentadienyl) Ruthenium, Mat. Res. Soc. Symp. Proc., vol. 495, 1998, pp. 75–80.

A. Belkind, et al, Optical Properties of $RuO_2$ Films Deposited by Reactive Sputtering, Thin Solid Films, 207 (1992), pp. 242–247.

K. Watanabe, et al, Characterization of Solution Derived $RuO_2$ Electrodes for Pb(Zr, Ti)$O_3$ Microcapacitors, J. Electrochem. Soc., vol. 143 No. 9, Sep. 1996, pp. 3008–3013.

Q. Jia, et al, Reactively Sputtered $RuO_2$ Thin Film Resistor with Near Zero Temperature Coefficient of Resistance, Thin Solid Films, 196 (1991), pp. 29–34.

S. Ardizzone, et al, Effect of the Nature of the Precursor on the Electrocatalytic Properties of Thermally Prepared Ruthenium Oxide, J. Electrochem. Soc., vol. 136, No. 5, May 1989, pp. 1545–1560.

K. Kuramasu, et al, Resistor film by Thermal Decomposition Technique and Thermal Decomposition Characteristics of Its Source Materials, Jour, Of the Ceramic Society of Japan, Int. Edition, vol. 104–840, 6 pages.

G. Lodi, et al, Ruthenium Dioxide–Based Film Electrodes. III. Effect of Chemical Composition and Surface Morphology on Oxygen Evolution in Acid Solutions, J. Applied Electrochemistry 8 (1978), pp. 135–143.

D. Galizzioli, et al, Ruthenium dioxide: A New Electrode Material. I. Behaviour in Acid Solutions of Inert Electrolytes, J. of Appl. Electrochemistry 4 (1974), pp. 57–67.

P. Patil, et al, Characterization of Ultrasonic Spray Pyrolysed Ruthenium Oxide Thin Films, Thin Solid Films 310 (1997), pp. 57–62.

M. Green, et al, Chemical Vapor Deposition of Ruthenium and Ruthenium Dioxide Films, J. Electrochem. Soc.: Solid–State Science & Technology, Nov. 1985, pp. 2677–2685.

A. Newkirk, et al, Thermal Decomposition of Rhodium, Iridium and Ruthenium Chlorides, J. of Catalysis 11, (1968), pp. 370–377.

HL Park, et al, Optical Properties of $RuO_2$ Thin Film, J. Mat. Sci. Lett., 6 (1987), pp. 1093–1094.

J. Zheng, et al, *Pulsed Laser Deposition*, J. Electrochem. Soc., vol. 143, No. 3, Mar. 1996, pp. 1068–1070.

L. Krusin–Elbaum, et al, Conducting Transition Metal Oxides: Possibilities for $RuO_2$ in VLSI Metallization, J. Electrochem Soc.. 135, No. 10, Oct. 1988, pp. 2610–2614.

G. Jang, et al, Thermolytic Formation of Noble Metals and Their Oxides From Chloride Precursor A Thermal Analysis Study, J. Electrochem. Soc. vol. 134, No. 7, pp. 1830–1835.

H. Cole, et al, *Laser–Activated Copper Deposition on Polyimide*, Proceedings of Laser Processes for Microelectronic Applications Symposium, vol. 88–10, pp. 187–192.

C. Coombs, Jr., *Printed Circuits Handbook*, $3^{rd}$ Edition, 1988, pp. 14.20–14.24.

Keith Casson "Applications", Chapter 5 in Handbook of Flexible Circuits, 1992, pp. 91–111.

* cited by examiner

METHOD OF FORMING RUTHENIUM OXIDE FILMS

STATEMENT REGARDING FEDERALLY SPONSORED RESEARCH & DEVELOPMENT

This invention was made with Government support under contract number DABT 63-99-c-0016 awarded by the United States Defense Advanced Research Projects Agency (DARPA). The United States Government has certain rights in the invention.

FIELD OF THE INVENTION

The present invention generally relates to processes for producing ruthenium dioxide films, such as for thin-film resistors used in electronic circuits. More particularly, this invention relates to a method for forming a ruthenium dioxide film by laser decomposing a ruthenium-containing precursor.

BACKGROUND OF THE INVENTION

Resistors formed of ruthenium dioxide ($RuO_2$) are widely recognized in the art for their reliability and stable resistance values. Other notable properties that make ruthenium dioxide of interest for various applications include its high temperature capability, resistance to acids, a hardness similar to fused silica, and electrical conductivity similar to that of ruthenium metal. Ruthenium dioxide also exhibits interesting optical and diffusion barrier properties. As a result, in addition to its use as a resistor material, ruthenium dioxide has been considered as a material for thermistors, electrodes for chlorine production, electrodes for microcapacitors, metallizations for very large scale integration (VLSI), optically transparent electrically conductive coatings, and antireflective coatings for photomasks.

Thick-film ruthenium dioxide resistors for hybrid electronic circuits are typically printed on ceramic substrates using inks that also contain an organic vehicle and a glass frit composition. However, a limitation of ruthenium dioxide resistors is that their inks must be fired in oxidizing atmospheres in order to prevent reducing ruthenium dioxide to metallic ruthenium. Various other processes for depositing a ruthenium dioxide film are known, including anodization, chemical vapor deposition (CVD), reactive sputtering, evaporation, thermolysis of precursors, ultrasonic spray pyrolysis, and pulsed laser deposition. However, limitations also exist with each of these processes. For example, anodization requires a precoating of ruthenium, thermolysis reactions require substrate temperatures in excess of 300° C., and sputtering techniques require elevated temperatures under vacuum conditions. In some cases, the deposited material also requires a high temperature annealing process. As an example, the thermal decomposition of precursors such as ruthenium chloride ($RuCl_3.nH_2O$) and ruthenium (III) nitrosyl salts (e.g., ruthenium (III) nitrosyl nitrate, $Ru(NO)(NO_3)_3$) have required annealing at temperatures typically above 300° C. to form crystalline ruthenium dioxide. See for example, Newkirk et al., *Journal of Catalysis*, 11 (1968) 370–377; Jang et al., *J. Electrochem. Soc.*, 134 (1987) 1830–1835; Galizzioli et al., *J. Appl. Electrochem.*, 4 (1974) 57–67; Lodi et al., *J. Appl. Electrochem.*, 8 (1978) 135–143; Ardizzone et al., *J. Electrochem. Soc.*, 136 (1989) 1545–1550; and U.S. Pat. No. 5,358,889 to Emesh et al. However, such thermal treatments exceed the maximum temperature capability of flexible polymeric materials. For example, though flexible substrates made of polyimide have one of the highest temperature ranges for processing, polyimides cannot be subjected to temperatures exceeding about 300° C. for extended periods of time.

In view of the above, it can be appreciated that it would be desirable if ruthenium dioxide could be deposited on a substrate without heating the bulk substrate and without annealing the deposited film following deposition. Such a method would enable ruthenium dioxide resistors to be formed on a wide variety of substrates, including non-ceramic materials that otherwise cannot withstand the high processing temperatures conventionally required to fire or anneal ruthenium dioxide films.

BRIEF SUMMARY OF THE INVENTION

The present invention provides a method of forming a ruthenium dioxide film for such purposes as the fabrication of stable thin-film resistors for microcircuits. The method does not require a thermal treatment that heats the bulk substrate on which the ruthenium dioxide film is formed, and is therefore compatible with non-ceramic substrates, e.g., polymeric substrates such as those used as printed circuit boards (PCB) and flexible circuits.

The method generally entails forming an inorganic ruthenium-based film on a substrate, and then thermally decomposing at least a portion of the ruthenium-based film by exposure to a high-intensity beam of radiation to yield a ruthenium dioxide film on the substrate. Particular ruthenium-based precursors suitable for forming the ruthenium-based film include ruthenium (III) chloride ($RuCl_3.nH_2O$) and ruthenium (III) nitrosyl salts (e.g., ruthenium (III) nitrosyl nitrate, $Ru(NO)(NO_3)_3$). Suitable precursors are generally colored (i.e., light-absorbing), soluble derivatives of ruthenium capable of being thermally decomposed at less than 300° C., and therefore also include ruthenocene (($C_5H_5)_2Ru$), ruthenium acetate, and triruthenium dodecacarbonyl ($Ru_3(CO)_{12}$). According to an embodiment of the invention, a high-intensity beam of radiation (e.g., visible light and particularly laser light) within an appropriate wavelength range and delivered at an appropriate power level is capable of decomposing certain ruthenium-based compounds to yield ruthenium dioxide without excessively heating the bulk substrate or its surface, yet is capable of completely converting the compounds to ruthenium dioxide that is suitable for use as a thin-film resistor without any subsequent thermal treatments that might damage the substrate. As a result, the present invention enables ruthenium dioxide films to be deposited on flexible polymeric substrates having a limited temperature capability, e.g., less than 300° C. With appropriate material selections, the method of this invention is compatible with metallic compositions for conductor traces, so that the ruthenium dioxide resistor can be formed before or after deposition and patterning of terminations for the resistor.

Other objects and advantages of this invention will be better appreciated from the following detailed description.

DETAILED DESCRIPTION OF THE INVENTION

Figure 1:
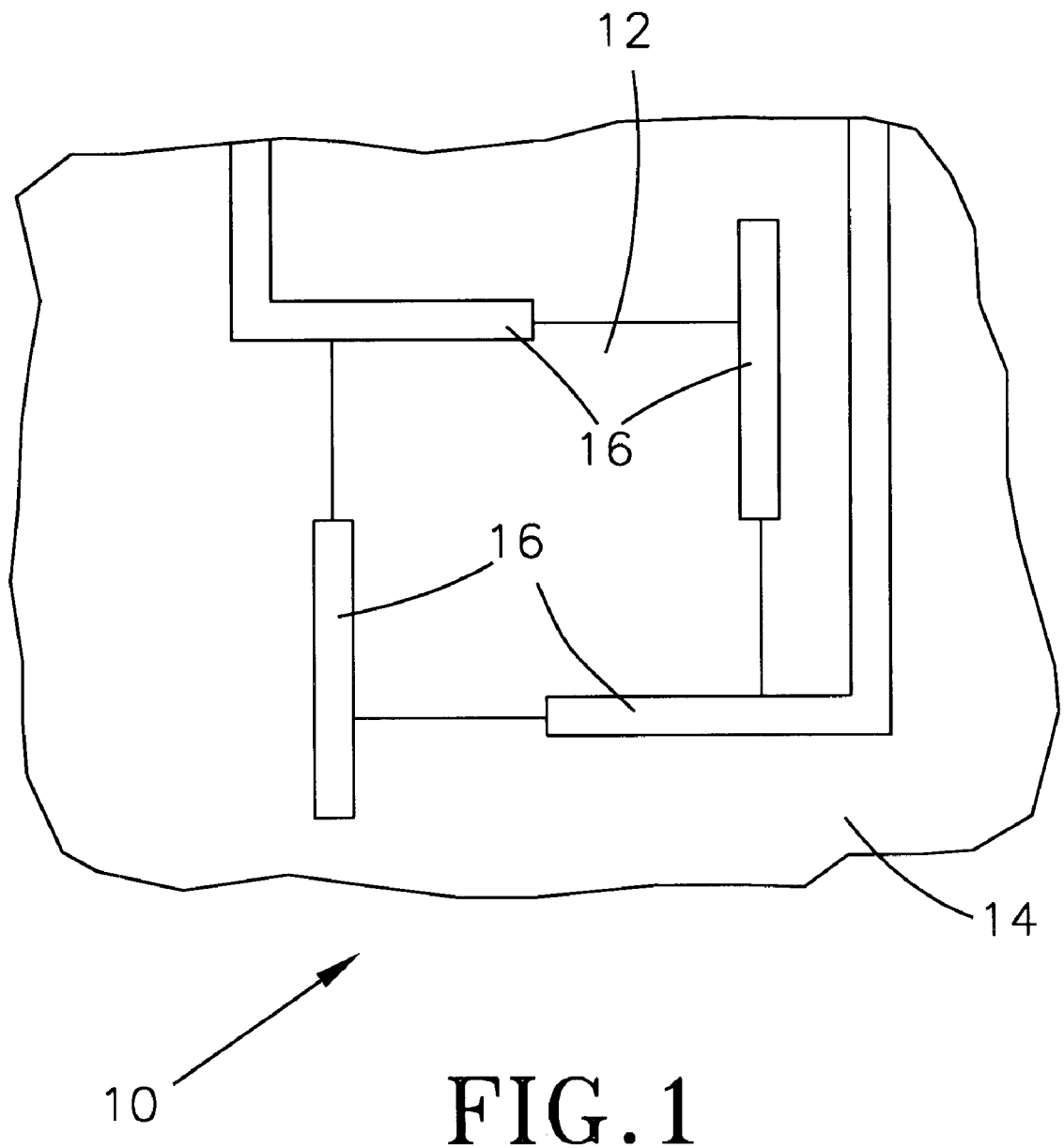
FIG. 1 represents a plan view of a ruthenium dioxide film deposited on a polymer substrate on which copper traces are present, in accordance with this invention.

In accordance with an embodiment of the present invention, ruthenium dioxide thin films have been produced from inorganic ruthenium-based compounds treated with a high-intensity beam of radiation, hereinafter referred to simply as light. The light beam can be directed to selected surface areas of a substrate through the use of masks or by raster or vector techniques, such that the film may be patterned to form a resistor or another electrical component of a microelectronic circuit. Substrates on which this conversion can be performed include flexible polymeric materials as well as refractory materials such as ceramics, including glass. Those skilled in the art will appreciate that numerous physical and compositional configurations and variations are possible for ruthenium dioxide films and resistors fabricated with the embodiments of this invention, and such configurations and variations are within the scope of the invention.

The use of lasers to induce the thermal decomposition of inorganic precursors to form films has been reported. See for example, Cole et al., "Laser-Activated Copper Deposition on Polyimide" in *Laser Processes for Microelectronic Applications*, Ritsko et al., Eds., Proceedings 88–10, Electrochemical Society, Pennington, N.J., 1988, 187–192; and Cole et al., *Appl. Phys. Lett.*, 53 (1988) 2111–2113. According to these papers, a laser beam can be focused onto the surface of a substrate, localizing the energy delivery to a limited surface region. As a result, thermal reactions can be confined to the surface of the substrate without affecting the bulk of the sample. However, the Cole et al. papers are limited to the thermal decomposition of organometallic palladium compounds to produce a catalytic monolayer of palladium for subsequent electroless plating of copper. Furthermore, Cole et al. required coupling of the laser energy to the substrate, rather than the precursor material. Instead, the laser energy was largely absorbed by the substrate, converted to heat, and then transferred to the palladium compound for decomposition. In doing so, heat spreading within the substrate resulted in limited resolution, i.e., heat was not localized within the focused laser beam. Because of their reliance on coupling laser energy to the substrate, the technique taught by Cole et al. cannot be performed on substrate materials that do not efficiently absorb laser energy, e.g., transparent or highly reflective materials.

The following examples report investigations by which different laser treatments, ruthenium-based precursor compounds, and substrate materials were evaluated.

EXAMPLE 1

In a first investigation, ruthenium (III) chloride was treated with visible laser light to form ruthenium dioxide films. As previously noted, ruthenium (III) chloride is known to thermally decompose to ruthenium dioxide in air at temperatures of 300° C. or more. In contrast, the visible laser light used to convert ruthenium (III) chloride to ruthenium dioxide in accordance with this embodiment of the invention does not appreciably heat the substrate on which this conversion takes place. Heating is localized in the thin ruthenium-based film instead of the bulk substrate. As such, substrate materials can be used with this embodiment that are incompatible with prior art thermal decomposition techniques.

In the investigation, a solution of ruthenium (III) chloride was prepared by adding 1.2 g of ruthenium (III) chloride hydrate to 25 mL of concentrated HCl [37% (w/w)]. This mixture was heated to a gentle boil, producing a dark red solution that was further heated until dry to yield solid ruthenium (III) chloride. This solid was then dissolved in 10 mL of isopropanol to produce a ruthenium (III) chloride solution that was spin coated at about 5000 rpm onto a 2×2 inch (about 5×5 cm) glass slide. The coated slide was then heated to about 50° C. for about 30 minutes to remove the isopropanol, producing a ruthenium (III) chloride film having a thickness of about 2000 Å and a resistance of greater than $10^6$ Ω/square. The film was then exposed to visible, multi-line Argon ion laser light (wavelength of about 457.9 to about 514.5 nm; power level of about 0.2 W), which visibly altered the film. Twenty passes of the laser light over the substrate at a scan rate of about 2.5 m/s produced a dark gray deposit that could not be removed by washing with isopropanol, unlike the precursor film of ruthenium (III) chloride. The deposit had a thickness of about 1000 Å and exhibited a resistance of about 400 Ω/square. Based on its appearance, properties and surface analysis using x-ray photoemission spectroscopy (XPS), the deposit was concluded to be essentially ruthenium dioxide.

EXAMPLE 2

In a second investigation, using the preparation technique described in Example 1, a film of ruthenium (III) chloride was cast onto a KAPTON E (KAPTON is a trademark of DuPont Co.) polyimide substrate having a thickness of about 1 mil (about 25 micrometers). A dark gray deposit of conductive ruthenium dioxide was again produced following treatment with visible, multi-line Argon ion laser light (wavelength of about 457.9 to about 514.5 nm; power level of about 0.2 W; scan rate of about 2.5 m/s). No deformation of the polymeric substrate occurred during this conversion. This investigation was repeated on an alumina substrate with similar results.

EXAMPLE 3

In another investigation, a ruthenium (III) chloride film was spin coated onto a glass slide in the same manner described in Example 1. In this investigation, the ruthenium (III) chloride film was exposed to visible, multi-line Argon ion laser light (wavelength of about 457.9 to about 514.5 nm; power level of about 0.2 W; scan rate of about 2.5 m/s) that was rastered to generate a pattern in the film. Twenty passes of the laser light over the substrate produced a patterned dark gray film of ruthenium dioxide having a thickness of about 1000 Å and a resistance of about 400 Ω/square. The unexposed ruthenium (III) chloride film was readily removed with an isopropanol rinse, leaving the patterned film of ruthenium dioxide. Features of approximately twenty-five micrometers could be resolved in the patterned film.

EXAMPLE 4

In a fourth investigation, a solution of ruthenium (III) chloride was prepared in accordance with Example 1, and then spin coated onto a two-inch (about 5 cm) diameter substrate of KAPTON E polyimide film on which was present a pattern of copper traces coated by either palladium or gold. The palladium and gold coatings served to protect the copper traces from the ruthenium (III) chloride precursor, which is known to etch copper. The coated film was heated to about 50° C. for about 30 minutes to remove the isopropanol, producing a film having a thickness of about 2000 Å and a resistance of greater than $10^6$ Ω/square. The film was then exposed to visible, multi-line Argon ion laser light (wavelength of about 457.9 to about 514.5 nm; power level of about 0.05 W; scan rate of about 2.5 m/s) that was rastered to generate a pattern in the film. One hundred passes of the laser light over the substrate produced a patterned dark gray deposit having a thickness of about 1000 Å and a resistance of about 400 Ω/square. The unexposed ruthenium (III) chloride film was removed with an isopropanol rinse, leaving a patterned film of ruthenium dioxide.

With Examples 1 through 4, it was demonstrated that ruthenium dioxide can be deposited by laser decomposition of ruthenium (III) chloride films. However, numerous passes of laser energy were used in order to produce deposits with low resistivity. In addition, solutions of ruthenium (III) chloride could not be directly applied to patterned copper traces without etching the traces. Both of these complications were concluded to be related to the nature of the precursor.

Specifically, for ruthenium (III) chloride to be converted to ruthenium dioxide, oxygen must diffuse into the film to achieve the following reaction.

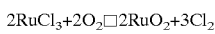
$$2RuCl_3 + 2O_2 \square 2RuO_2 + 3Cl_2$$

This reaction is limited by the rate of oxygen diffusion. Ruthenium (III) chloride was predicted to have a reactivity similar to that of ferric chloride, which is a known etchant of copper according to the following reaction.

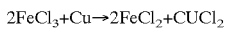
$$2FeCl_3 + Cu \rightarrow 2FeCl_2 + CuCl_2$$

From the above, it was concluded that a different precursor would be advantageous for forming ruthenium dioxide films alongside copper traces.

EXAMPLE 5

In a final investigation, ruthenium dioxide was selectively deposited onto flexible substrates by means of laser decomposition of cast ruthenium (III) nitrosyl nitrate films to form resistor structures. Notably, ruthenium (III) nitrosyl nitrate does not etch copper, and furthermore does not require oxygen for its conversion to ruthenium dioxide in accordance with the following equation.

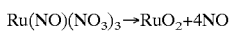
$$Ru(NO)(NO_3)_3 \rightarrow RuO_2 + 4NO$$

However, according to U.S. Pat. No. 5,358,889 to Emesh et al., ruthenium (III) nitrosyl nitrate thermally decomposes to ruthenium dioxide at temperatures on the order of about 200° C. to about 400° C., which is excessive for many polymer materials and marginal for high-temperature polymers such as polyimides. From the results of Examples 1 through 4, it was believed that these limitations were surmountable with the use of a high-intensity light beam that produced localized heating of a thin film of ruthenium (III) nitrosyl nitrate if beam resolution was adequate and time at temperature was sufficiently brief to avoid thermally degrading the substrate and oxidizing the copper traces.

A 1% solution of ruthenium (III) nitrosyl nitrate was dissolved in isopropanol to form a solution that was spin coated onto a two-inch (about 5 cm) diameter substrate of KAPTON E polyimide. A pattern of copper traces was previously formed on the film, with areas left vacant for deposition of the solution. The coated film was heated to about 50° C. for about 30 minutes to remove the isopropanol, yielding a film having a thickness of about 2000 Å and a resistance of greater than $10^6$ Ω/square. The film was then selectively exposed to visible, multi-line Argon ion laser light (457.9–514.5 nm; about 0.45 W) using a raster technique to generate a visibly altered pattern in the film. Only five passes of the laser light were necessary to yield a dark gray ruthenium dioxide film having a thickness of about 1000 Å, a resistance of about 5500 Å/square, and a TcR of about −450 ppm° C. over a range of about 25° C. to about 125° C. Unexposed ruthenium (III) nitrosyl nitrate was removed by an isopropanol rinse, leaving the patterned ruthenium dioxide film. FIG. 1 depicts a specimen 10 processed during this investigation, wherein the ruthenium dioxide film 12 is shown on a polyimide substrate 14 and terminated with copper traces 16. Importantly, the copper traces were not affected by the ruthenium precursor or the laser beam.

From the above, it was concluded that suitable ruthenium dioxide films could be produced from certain ruthenium-based compounds through exposure to visible laser light. From the investigations, it is believed that laser light in a wavelength range of about 457.9 to about 514.5 nm and a power level of about 0.05 to 1 W is suitable, though it is foreseeable that similar results could be achieved outside these ranges. For example, longer wavelengths are believed acceptable, including those in the infrared spectrum (above 780 nm). Furthermore, it may be possible to use a focused beam of incoherent light. Importantly, the wavelength of the light should be such that the light is strongly absorbed by the precursor to maximize heating of the precursor, but then transmitted or reflected after the precursor has been converted to ruthenium dioxide to minimize damage from overheating. Wavelengths shorter than those evaluated can be used, but would be strongly absorbed by the substrate to the extent that degradation and/or ablation of the precursor and substrate may occur. Finally, it is believed that the scan rate is an important parameter, and that while a scan rate of about 2.5 m/s was used, a range of about 0.25 mm/s to about 25 m/s would be acceptable if lower or higher power levels are appropriately used, e.g., a scan rate of about 1 mm/s for a power level of about 0.01 W.

While the invention has been described in terms of particular embodiments, it is apparent that other forms could be adopted by one skilled in the art. For example, while ruthenium (III) chloride and ruthenium (III) nitrosyl nitrate were used as the precursors, it is believed that other ruthenium-based precursors could be laser decomposed to form ruthenium dioxide in accordance with this invention, including ruthenocene, ruthenium acetate, and triruthenium dodecacarbonyl, and other ruthenium-based compounds that decompose to ruthenium dioxide at temperatures below about 300° C. Accordingly, the scope of the invention is to be limited only by the following claims.

What is claimed is:

1. A method of forming a ruthenium dioxide film on a substrate, the method comprising the steps of:
    forming an inorganic ruthenium-based film on the substrate; and then
    thermally decomposing at least a portion of the ruthenium-based film by exposure to a high-intensity beam of radiation to yield a ruthenium dioxide film on the substrate.

2. A method according to claim 1, wherein the ruthenium-based film is chosen from the group consisting of ruthenium (III) chloride, ruthenium (III) nitrosyl salts, ruthenocene, ruthenium acetate, triruthenium dodecacarbonyl, and ruthenium-based compounds that decompose to ruthenium dioxide at temperatures below 300° C.

3. A method according to claim 1, wherein the radiation is in a wavelength range of at least 457.9 nm.

4. A method according to claim 3, wherein the radiation is delivered at a power level of about 0.05 to about 1 W.

5. A method according to claim 1, wherein the radiation is projected onto the ruthenium-based film to generate a pattern comprising the ruthenium dioxide film and an unexposed portion of the ruthenium-based film.

6. A method according to claim 5, wherein the pattern is generated by a mask or by a raster or vector technique using a scan rate of about 0.25 mm/s to about 25 m/s.

7. A method according to claim 5, further comprising the step of removing the unexposed portion of the ruthenium-based film.

8. A method according to claim 1, wherein the substrate is a non-ceramic material.

9. A method according to claim 1, further comprising the step of forming conductor traces on the substrate prior to forming the ruthenium-based film, the conductor traces contacting the ruthenium dioxide film so that the conductor traces and the ruthenium dioxide film define a resistor.

10. A method according to claim 9, wherein the conductor traces have a noble metal surface and the ruthenium-based film is ruthenium (III) chloride.

11. A method according to claim 9, wherein the conductor traces are copper-based and the ruthenium-based film is ruthenium (III) nitrosyl nitrate.

12. A method according to claim 1, wherein the step of forming the ruthenium-based film comprises dissolving a ruthenium-based compound in alcohol to form a solution, depositing the solution on the substrate, and then drying the solution to form the ruthenium-based film.

13. A method of forming a ruthenium dioxide resistor on a non-ceramic substrate having terminations with at least a surface thereof formed of a noble metal, the method comprising the steps of:

forming traces on the substrate, the traces having at least a surface portion formed of a noble metal;

forming a ruthenium (III) chloride film on the substrate, the ruthenium (II) chloride film contacting the traces; and then thermally decomposing at least a portion of the ruthenium (III) chloride film by exposure to laser light to yield a ruthenium dioxide film on the substrate, the ruthenium dioxide film contacting the traces so that the traces and the ruthenium dioxide film define a resistor.

14. A method according to claim 13, wherein the laser light is in a wavelength range of 457.9 to 514.5 nm and is delivered at a power level of about 0.05 to about 1 W and at a scan rate of about 2.5 m/s.

15. A method according to claim 13, wherein the laser light is projected onto the ruthenium (III) chloride film to generate a pattern comprising the ruthenium dioxide film and an unexposed portion of the ruthenium (III) chloride film, the method further comprising the step of removing the unexposed portion of the ruthenium (III) chloride film.

16. A method according to claim 13, wherein the step of forming the ruthenium (III) chloride film comprises dissolving ruthenium (III) chloride in alcohol to form a solution, depositing the solution on the substrate, and then drying the solution to form the ruthenium (III) chloride film.

17. A method of forming a ruthenium dioxide resistor with copper terminations on a non-ceramic substrate, the method comprising the steps of:

forming copper traces on the substrate;

forming a ruthenium (III) nitrosyl nitrate film on the substrate, the ruthenium (III) nitrosyl nitrate film contacting the copper traces; and then thermally decomposing at least a portion of the ruthenium (III) nitrosyl nitrate film by exposure to laser light to yield a ruthenium dioxide film on the substrate, the ruthenium dioxide film contacting the copper traces so that the copper traces and the ruthenium dioxide film define a resistor.

18. A method according to claim 17, wherein the laser light is in a wavelength range of 457.9 to 514.5 nm and is delivered at a power level of about 0.45 W and at a scan rate of about 2.5 m/s.

19. A method according to claim 17, wherein the laser light is projected onto the ruthenium (III) nitrosyl nitrate film to generate a pattern comprising the ruthenium dioxide film and an unexposed portion of the ruthenium (III) nitrosyl nitrate film, the method further comprising the step of removing the unexposed portion of the ruthenium (II) nitrosyl nitrate.

20. A method according to claim 17, wherein the step of forming the ruthenium (III) nitrosyl nitrate film comprises dissolving ruthenium (III) nitrosyl nitrate in alcohol to form a solution, depositing the solution on the substrate, and then drying the solution to form the ruthenium (III) nitrosyl nitrate film.

* * * * *